United States Patent
Hirota et al.

(10) Patent No.: US 8,002,892 B2
(45) Date of Patent: Aug. 23, 2011

(54) GROUP III NITRIDE CRYSTAL SUBSTRATE, METHOD OF ITS MANUFACTURE, AND GROUP III NITRIDE SEMICONDUCTOR DEVICE

(75) Inventors: Ryu Hirota, Itami (JP); Seiji Nakahata, Itami (JP); Masaki Ueno, Itami (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 218 days.

(21) Appl. No.: 10/905,845

(22) Filed: Jan. 24, 2005

(65) Prior Publication Data

US 2005/0164419 A1    Jul. 28, 2005

(30) Foreign Application Priority Data

Jan. 23, 2004  (JP) ................... 2004-015647
Oct. 19, 2004  (JP) ................... 2004-304073

(51) Int. Cl.
*C30B 25/02* (2006.01)
(52) U.S. Cl. ............... 117/84; 117/54; 117/64; 117/88; 117/91; 117/99; 117/952
(58) Field of Classification Search ............ 117/54, 117/64, 84, 88, 91, 99, 952
See application file for complete search history.

(56) References Cited

U.S. PATENT DOCUMENTS

| | | | |
|---|---|---|---|
| 6,156,581 A * | 12/2000 | Vaudo et al. | 438/22 |
| 6,413,627 B1 * | 7/2002 | Motoki et al. | 428/332 |
| 7,335,262 B2 * | 2/2008 | Dwilinski et al. | 117/206 |
| 2002/0166502 A1 * | 11/2002 | Vaudo et al. | 117/89 |
| 2002/0192507 A1 * | 12/2002 | Dwilinski et al. | 428/698 |
| 2003/0209185 A1 * | 11/2003 | Ueno et al. | 117/2 |
| 2005/0217565 A1 * | 10/2005 | Lahreche et al. | 117/84 |
| 2006/0051942 A1 * | 3/2006 | Sasaki et al. | 438/483 |
| 2006/0191472 A1 * | 8/2006 | Dwilinski et al. | 117/81 |

FOREIGN PATENT DOCUMENTS

| | | |
|---|---|---|
| JP | 2002-201100 A | 7/2002 |
| JP | 2003-273019 A | 9/2003 |
| WO | WO03/097906 A1 * | 11/2003 |
| WO | WO 03097906 A1 * | 11/2003 |
| WO | WO 03100839 A2 * | 12/2003 |
| WO | WO-2004-013385 A1 | 2/2004 |

OTHER PUBLICATIONS

Kawamura et al., "Growth of a Large GaN Single Crystal using the Liquid Phase Epitaxy (LPE) Technique", Jpn. J. Appl. Phys. vol. 42 (2003) pp. L4-L6.*

(Continued)

*Primary Examiner* — Matthew Song
(74) *Attorney, Agent, or Firm* — James W. Judge

(57) ABSTRACT

Affords a Group-III nitride crystal substrate that is of low dislocation density and is inexpensive to manufacture, a method of manufacturing such a substrate, and Group-III nitride semiconductor devices that incorporate the Group-III nitride crystal substrate. The Group-III nitride crystal substrate manufacturing method includes: a step of growing, by liquid-phase epitaxy, a first Group-III nitride crystal (2) onto a base substrate (1); and a step of growing, by vapor-phase epitaxy, a second Group-III nitride crystal (3) onto the first Group-III nitride crystal (2). The Group-III nitride crystal substrate, produced by such a manufacturing method, has a dislocation density of $1 \times 10^7$ dislocations/cm$^2$.

2 Claims, 7 Drawing Sheets

OTHER PUBLICATIONS

Isamu Akasaki, "Group-III Nitride Semiconductor," 1st Ed., Baifukan, Tokyo, 1999, (pp. 67-91).

Hisanori Yamane, et al., "Preparation of GaN Single Crystals Using a Na Flux," Chem. Mater., vol. 9, 1997, pp. 413-416.

Fumio Kawamura, et al., "Growth of a Large GaN Single Crystal Using the Liquid Phase Epitaxy (LPE) Technique," Jpn. J. Appl. Phys., vol. 42 (2003), Part 2, No. 1A/B, Jan. 15, 2003, (pp. L4-L6).

Takayuki Inoue, et al., "Growth of Bulk GaN Single Crystals by the Pressure-Controlled Solution Growth Method," Jpn. J. Appl. Phys., vol. 39 (2000), Part 1, No. 4B, Apr. 2000, (pp. 2394-2398).

V.A. Sukhoveyev et al., "GaN 20-mm Diameter Ingots Grown from Melt-Solution by Seeded Technique," GaN and Related Alloys—1999. Symposium (Materials Research Society Symposium Proceedings vol. 595), pp. W6.6.1-6, XP-002520881, Mater. Res. Soc. Warrendale, PA.

* cited by examiner

GROUP III NITRIDE CRYSTAL SUBSTRATE, METHOD OF ITS MANUFACTURE, AND GROUP III NITRIDE SEMICONDUCTOR DEVICE

BACKGROUND OF THE INVENTION

1. Field of the Invention

The present invention relates to a Group-III nitride crystal substrate that is of low dislocation density and is inexpensive to manufacture, to a method of manufacturing such a substrate, and to Group-III nitride semiconductor devices that incorporate the Group-III nitride crystal substrate.

2. Description of the Background Art

To serve as the substrates for semiconductor electronic and optoelectronic devices including semiconductor lasers and LEDs (light-emitting diodes), Group-III nitride crystal substrates of large size and low dislocation density are being pursued in recent years.

To manufacture Group-III nitride crystal substrates, vapor-phase techniques enable crystal-growth rates of 100 µm/hr or greater; and among vapor-phase techniques, hydride vapor-phase epitaxy (HVPE hereinafter) is being utilized as powerful tool for rapid crystal growth. (Cf., for example, Isamu Akasaki, *Group-III Nitride Semiconductors*, 1$^{st}$ Ed., Baifu-kan, Tokyo, 1999, pp. 67-91.)

Meanwhile, metalorganic chemical vapor deposition (MOCVD hereinafter), in which the crystal growth rate is highly controllable and which is suited to depositing thin films with a planar surface, is being utilized as a powerful tool to grow a Group-III nitride crystal layer onto a base substrate. (Cf. ibid.) A crystal layer thus having been created on a base substrate is usually referred to as a template. For instance, templates that are a layer of Group-III nitride crystal having been grown by MOCVD onto a sapphire plate as a base substrate are being employed as a substitute for Group-III nitride crystal substrates.

Given that a base substrate is necessary, however, to grow Group-III nitride crystal by either the HVPE or MOCVD technique, the dislocation density of a Group-III nitride crystal substrate, or of the Group-III nitride crystal layer on a template, will depend on the dislocation density of its base substrate. Moreover, when Group-III nitride crystal has been grown on a foreign substrate, such as a sapphire or SiC plate, as the base substrate rather than a native Group-III nitride substrate, the dislocation density of the epitaxial Group-III nitride crystal has tended to increase further, owing to the crystal-lattice mismatch, and the difference in thermal expansion coefficient, between the base substrate and the epitaxial crystal layer.

Although HVPE and MOCVD each has its advantages, as noted above—with the former technique crystal growth is rapid, and with the latter, the ability to control crystal growth rates is outstanding—in that they do not enable crystal dislocation density to be adequately lowered, the techniques have not proven to be practical methods for the manufacture of Group-III nitride crystal substrates.

In contrast to HVPE and MOCVD, with liquid-phase techniques, which are typified by flux-growth and the high-nitrogen-pressure solution growth techniques, because crystal growth proceeds in a quasi-equilibratory state that is near equilibrium thermodynamically, compared with vapor-phase techniques, which employ highly reactive gases, nucleation during growth is kept under control, generally yielding Group-III nitride crystal of low dislocation density and superior crystallinity. (Cf., for example, Hisanori Yamane, et al., "Preparation of GaN Single Crystals Using a Na Flux," *Chemistry of Materials*, Vol. 9, 1997, pp. 413-416; Fumio Kawamura, et al., "Growth of a Large GaN Single Crystal Using the Liquid Phase Epitaxy (LPE) Technique," *Japanese Journal of Applied Physics*, Vol. 42, 2003, pp. L4-L6; and Takayuki Inoue, et al., "Growth of Bulk GaN Single Crystals by the Pressure-Controlled Solution Growth Method," *Japanese Journal of Applied Physics*, Vol. 39, 2000, pp. 2394-2398.)

Turning to an example, apart from Group-III nitride crystal, of Group III-V crystal through a vapor-phase technique: Growing a layer of GaAs or AlGaAs crystal onto a GaAs substrate by a vapor-phase technique using self-flux produces a planar crystalline layer whose dislocation density is lower than that of the base substrate, because in this case as well, crystal growth proceeds in a quasi-equilibrium state. Given the low dislocation density of the crystal layers, highly durable red light-emitting diodes may be manufactured by forming electrodes and associated components on the crystal after it is made into chips. Such crystal has therefore been widely used to date in such applications as the light-emitting component in remote controls.

Although, as discussed above, lowering of dislocation density by means of liquid-phase epitaxy has been confirmed in Group-III nitride crystals (Ibid., Fumio Kawamura and Takayki Inoue)—as is the case with the other materials just mentioned—owing to nitrogen's high equilibrium vapor pressure, the amount of nitrogen that dissociates into the vapor phase is generally low, resulting in a crystal growth rate that is a sluggish 10 µm/hr. Moreover, notwithstanding the slowness of the crystal growth, to steadily maintain a thermodynamically quasi-stable state under high temperature and pressure is challenging in terms of the equipment as well as the technology; hence, without being able to adequately control the growth rate, a problem with growing Group-III nitride crystals by liquid-phase epitaxy has been poor surface planarity, an example of which is hexagonally shaped projections, appearing in the crystal surface, that are indicative of a wurtzite type of hexagonal crystalline structure. For these reasons, attempts using liquid-phase epitaxy to produce substrates for optical devices such as blue-violet lasers, blue LEDs, and white LEDs, or for electronic devices such as field-effect transistors, require prolonged periods of time for the crystal growth, and moreover, the crystal must go through an operation to planarize the surface by polishing or a like process; the consequently high manufacturing costs have been prohibitive of making the technique practical.

SUMMARY OF THE INVENTION

An object of the present invention, in view of the foregoing circumstances, is to afford a Group-III nitride crystal substrate that is of low dislocation density and is inexpensive to manufacture, a method of manufacturing such a substrate, and Group-III nitride semiconductor devices that incorporate the Group-III nitride crystal substrate.

In order to achieve the foregoing objective, the present invention in one aspect is a Group-III nitride crystal substrate manufacturing method that includes: a step of growing, by liquid-phase epitaxy, a first Group-III nitride crystal onto a base substrate; and a step of growing, by vapor-phase epitaxy, a second Group-III nitride crystal onto the first Group-III nitride crystal.

By combining liquid-phase epitaxy—and an advantage to which is that the dislocation density of the growth crystal is low, while disadvantages are that the crystal growth is slow and the crystal-surface planarity is low—with vapor-phase epitaxy—advantages to which are that crystal growth is rapid and the crystal-surface planarity is high, while a disadvantage is that the dislocation density of the crystal is high—the foregoing manufacturing method enables the manufacture of Group-III nitride crystal substrates featuring the respective advantages of each technique—low dislocation density in the growth crystal, and rapid crystal growth as well as a highly planar crystal surface.

In a method involving the present invention of manufacturing Group-III nitride crystal, it is preferable that the base substrate be a Group-III nitride substrate, or else a substrate in which a Group-III nitride crystal layer has been formed on the face on which the foregoing first and second Group-III nitride crystals are grown.

Also preferable in a method involving the present invention of manufacturing Group-III nitride crystal is that either a flux-growth technique or high-nitrogen-pressure solution growth technique be utilized for the liquid-phase epitaxy, and that hydride vapor-phase epitaxy or metalorganic chemical vapor deposition be utilized for the vapor-phase epitaxy.

In another aspect, the present invention is a Group-III nitride crystal substrate manufacturing method that includes a step of growing, by liquid-phase epitaxy, a first Group-III nitride crystal onto a base substrate, and a step of growing, by hydride vapor-phase epitaxy or metalorganic chemical vapor deposition, a second Group-III nitride crystal onto the first Group-III nitride crystal, the method of manufacturing a Group-III nitride crystal substrate being characterized in that in the step of growing the second Group-III nitride crystal, the surface of the second Group-III nitride crystal planarizes to a roughness of 0.5 µm or less in peak-to-valley roughness ($R_{p\text{-}v}$).

In a further aspect, the present invention is a Group-III nitride crystal substrate manufacturing method that includes: a step of growing, by liquid-phase epitaxy, a first Group-III nitride crystal onto a base substrate; a step of growing, by hydride vapor-phase epitaxy, a second Group-III nitride crystal onto the first Group-III nitride crystal; and a step of dividing the first Group-III nitride crystal and/or the second Group-III nitride crystal, by slicing or cleavage.

In still another aspect, the present invention is Group-III nitride crystal substrates manufactured by the foregoing Group-III nitride crystal substrate manufacturing methods. It is preferable that the dislocation density of a Group-III nitride crystal substrate involving the present invention be no more than $1 \times 10^7$ dislocations/cm$^2$.

The present invention also contemplates Group-III nitride semiconductor devices that incorporate the foregoing Group-III nitride crystal substrates.

In accordance with the present invention, Group-III nitride crystal substrates that are of low dislocation density and are inexpensive to manufacture, and methods of manufacturing such substrates, are made available, as are Group-III nitride semiconductor devices that incorporate the Group-III nitride crystal substrates.

From the following detailed description in conjunction with the accompanying drawings, the foregoing and other objects, features, aspects and advantages of the present invention will become readily apparent to those skilled in the art.

BRIEF DESCRIPTION OF THE DRAWINGS

FIG. 1 is sectional outline views for explaining one preferred method of manufacturing a Group-III nitride crystal substrate in the present invention, wherein

FIG. 2 is outline views illustrating a first Group-III nitride crystal grown by liquid-phase epitaxy atop portions of a substrate, wherein

FIG. 3 is sectional outline views for explaining a different preferred method of manufacturing a Group-III nitride crystal substrate in the present invention, wherein

FIG. 4 is sectional outline views for explaining a still different preferred method of manufacturing a Group-III nitride crystal substrate in the present invention, wherein

FIG. 5 is outline views illustrating the disposition of a base substrate in one preferred method of manufacturing a Group-III nitride crystal substrate in the present invention, wherein

FIG. 6 is outline views illustrating the disposition of a base substrate in a different preferred method of manufacturing a Group-III nitride crystal substrate in the present invention, wherein

DETAILED DESCRIPTION OF THE INVENTION

Figure 1A:
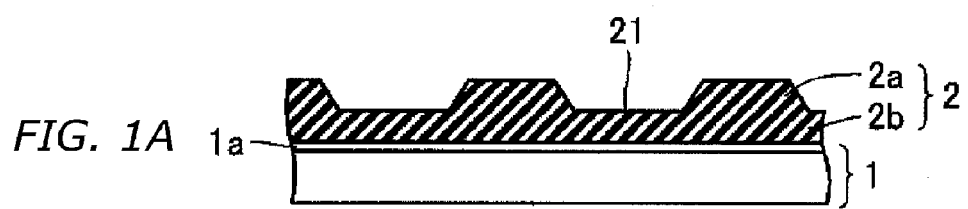
FIG. 1A illustrates a step of growing a first Group-III nitride crystal by liquid-phase epitaxy.
Figure 1B:
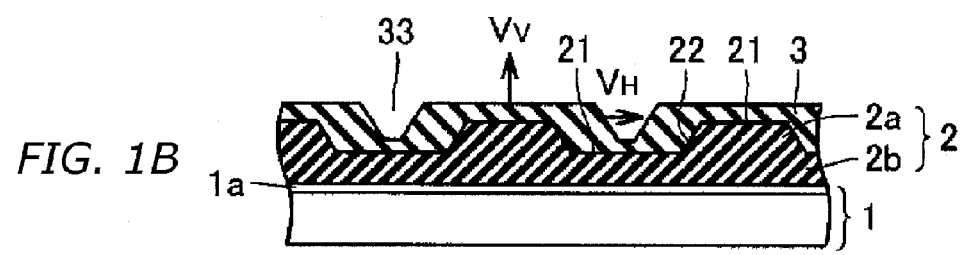
FIGS. 1B-D illustrate steps of growing a second Group-III nitride crystal by vapor-phase epitaxy.
Figure 1C:
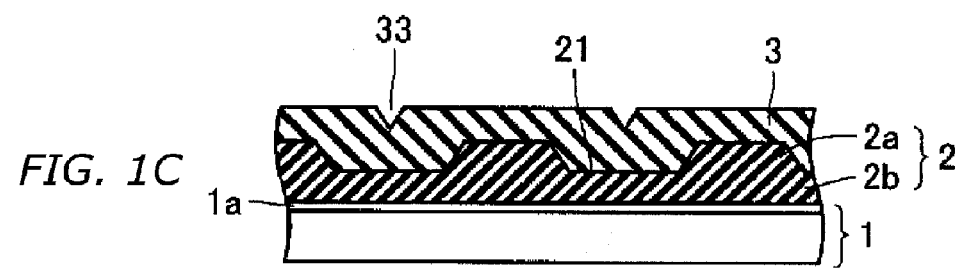
Figure 1D:
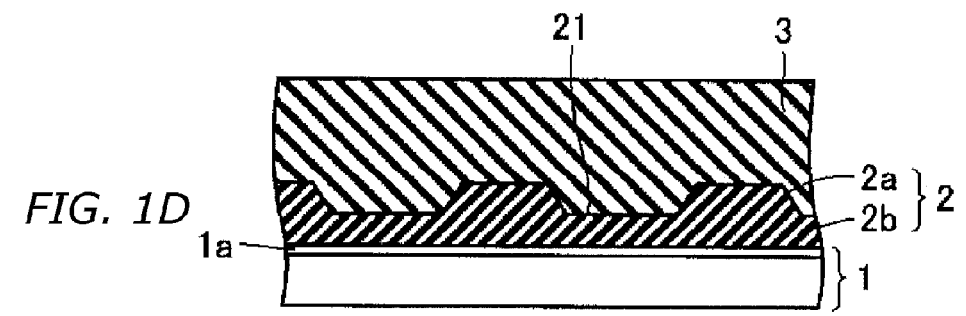

A method, involving the present invention, of manufacturing a Group-III nitride crystal substrates includes—with reference to FIG. 1 for example—a step of growing by liquid-phase epitaxy a first Group-III nitride crystal 2 onto a base substrate 1, as illustrated in FIG. 1A, and a step of growing by vapor-phase epitaxy a second Group-III nitride crystal 3 onto the first Group-III nitride crystal 2, as illustrated in FIGS. 1B-1D. Including these steps achieves a first Group-III nitride crystal and a second Group-III nitride crystal of low dislocation density.

Figure 2A:
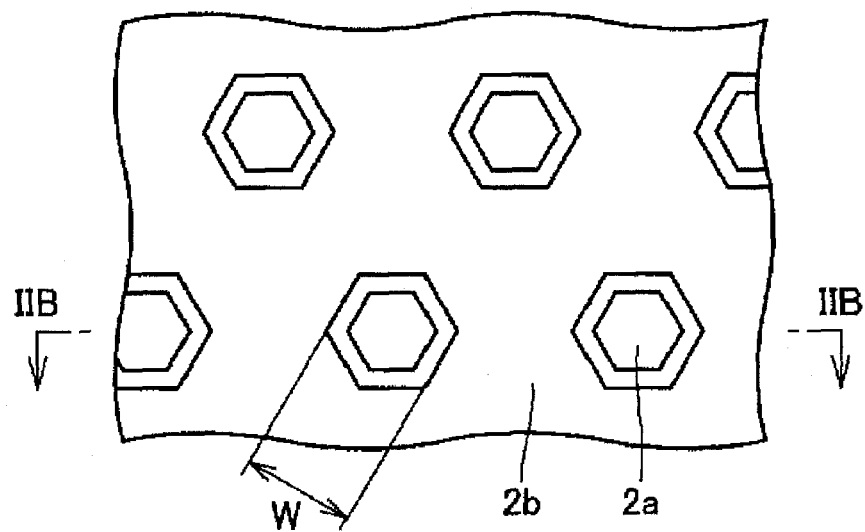
FIG. 2A depicts an outline plan view seen from overhead.
Figure 2B:
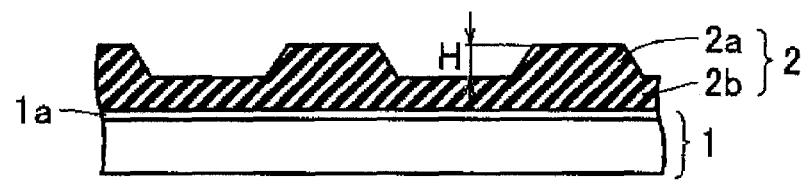
FIG. 2B depicts an outline section through IIB-IIB in FIG. 2A.

That the dislocation density of the first Group-III nitride crystal and the second Group-III nitride crystal is low is presumed to be for the following reasons. With reference to both FIGS. 1 and 2, at first, when growth of the first Group-III nitride crystal onto the substrate 1 is carried out by liquid-phase epitaxy, the surface of the first Group-III nitride crystal 2 is not planar; one or more (a plurality ordinarily) features 2a—in the form of polygons that are of some 300 µm in width W when viewed from overhead, as illustrated in FIG. 2, and that in section, as illustrated in FIGS. 2B and 1A, are in the form of trapezoids some 3 µm in height H—form on a floor 2b of the first Group-III nitride crystal. Because liquid-phase epitaxy is a technique that causes crystal to grow in a state that, by comparison vapor-phase epitaxy, is nearer to thermodynamic equilibrium, the crystal nuclei initially generated atop the base substrate 1 are few, with the result that the dislocation density of the first Group-III nitride crystal 2 having grown in a quasi-equilibrium state from the few crystal nuclei will be low. In the present situation, because crystal growth of the features 2a on the first Group-III nitride crystal proceeds further than that of the floor 2b, the dislocation density turns out even lower.

Next, when the second Group-III nitride crystal is epitaxially grown, at a growth rate of some 3 μm/hr, by vapor-phase epitaxy onto the first Group-III nitride crystal, the growth velocity $V_H$, as indicated in FIG. 1B, of the second Group-III nitride crystal 3 along the sloping surfaces 22 of the features 2a on the first Group-III nitride crystal 2 is greater than the growth velocity $V_v$ of the second Group-III nitride crystal 3 over the flat surfaces 21 of the floor 2b and over the flat surfaces 21 of the features 2a. Consequently, the second Group-III nitride crystal 3 grows covering over the flat surfaces 21 of the floor 2b and the flat surfaces 21 of the features 2a, and as depicted in FIGS. 1B and 1C, the surface breaks 33 in second Group-III nitride crystal 3 grow smaller, yielding, as depicted in FIGS. 1C and 1D, a second Group-III nitride crystal 3 having a nearly planar or a planar surface. Herein, since much of the growth of the second Group-III nitride crystal is from the sloping surfaces 22 of the features 2a on the first Group-III nitride crystal, whose dislocation density is low, low dislocation density is produced in the second Group-III nitride crystal. Moreover, the fact that the planarity of the Group-III nitride crystal surface is improved contributes to reducing the cost of surface polishing and associated processes to render the crystal into a substrate for semiconductor device fabrication.

In the present specification, although, for the sake of explaining the methods of manufacturing a Group-III nitride crystal substrates, the discussion distinguishes the Group-III nitride crystal produced by liquid-phase epitaxy as "first Group-III nitride crystal," and the Group-III nitride crystal produced by vapor-phase epitaxy as "second Group-III nitride crystal," since the second Group-III nitride crystal is grown onto first Group-III nitride crystal with which it matches well, the Group-III nitride crystal can be utilized as a unity.

In a Group-III nitride crystal substrate manufacturing method involving the present invention, for the base substrate, not being particularly limited, substrates of a Group-III nitride, of sapphire, or of SiC, for example, can be utilized. Nevertheless, from the perspective of slightness of lattice mismatch with, and difference in thermal expansion coefficient from, Group-III nitride crystal, to facilitate growth of Group-III nitride crystal of low dislocation density, referring to FIG. 1, it is preferable that the base substrate 1 employed in the present invention be a Group-III nitride substrate, or a substrate in which a Group-III nitride crystal layer 1a is formed on the face for growing Group-III nitride crystal. In particular, in Group-III nitride crystal manufacturing implementations according to the present invention in which a foreign substrate, such as a sapphire substrate or an SiC substrate, is to be used for the base substrate, it is preferable to have the base substrate be one in which a Group-III nitride crystal layer has been formed onto these substrate materials. In doing so, the formation of a Group-III nitride crystal layer onto a sapphire, SiC, or other substrate preferably is carried out using HVPE or MOCVD.

In a Group-III nitride crystal substrate manufacturing method involving the present invention, preferably either flux growth or high-nitrogen-pressure solution growth is utilized as the liquid-phase technique. These techniques allow first Group-III nitride crystal of low dislocation density to be grown with ease.

Flux growth is a technique in which, under a temperature of some 600 to 1400° C. and a pressure of some 0.1 MPa to 10 MPa, nitrogen is dissolved into a melt containing a Group III element and a flux to carry out growth of Group-III nitride crystal. An alkali metal or a transition metal preferably is used as the flux. For example, if the Group III element is Ga, it is preferable to use Na, which is an alkali metal; if the Group III element is Al, it is preferable to use Fe, Mn or Cr, which are transition metals. Meanwhile, high-nitrogen-pressure solution growth is a technique in which, under a temperature of approximately 1500° C. and a high nitrogen pressure of some 1 GPa to 2 GPa, nitrogen is dissolved into a Group III element melt (a Ga melt, for example) to carry out growth of Group-III nitride crystal (GaN crystal, for example).

An additional preference in a Group-III nitride crystal substrate manufacturing method involving the present invention is that HVPE or MOCVD be utilized as the vapor-phase technique, as either enables second Group-III nitride crystal of low dislocation density readily to be grown taking on the low-dislocation-density characteristics of the first Group-III nitride crystal.

HVPE is a technique in which Group-III nitride crystal is grown by reacting in the vapor phase a halogenated Group III element and a nitrogen-containing substance such as ammonia ($NH_3$), and to grow GaN crystal, GaCL gas produced by reacting metallic Ga and hydrogen chloride (HCl) is reacted with $NH_3$ gas. Although HVPE cannot grow crystal with as low a dislocation density as liquid-phase epitaxy can, because the crystal-growth rate can be quickened up to the 100 μm/hr level, sizably thick Group-III nitride crystal can readily be produced.

In turn, MOCVD is a technique in which Group-III nitride crystal is grown by reacting in the vapor phase an organometallic compound containing a Group III element (compounds such as TMG (trimethyl gallium) or TMA (trimethyl aluminum), for example), and a nitrogen-containing substance such as $NH_3$. Although the crystal-growth rate with MOCVD is a slow 3 μm/hr or so, the superior crystal-growth controllability with the technique facilitates growing the crystal surface evenly.

In particular, one preferred method of manufacturing a Group-III nitride crystal substrate in the present invention includes—with reference to FIG. 1—a step of growing by liquid-phase epitaxy a first Group-III nitride crystal 2 onto a substrate 1, as illustrated in FIG. 1A, and a step of growing by either HVPE or MOCVD a second Group-III nitride crystal 3 onto the first Group-III nitride crystal 2, as illustrated in FIGS. 1B-1D. And in the Group-III nitride crystal substrate manufacturing method, in the step of growing the second Group-III nitride crystal, the surface of the second Group-III nitride crystal planarizes to a surface roughness of 0.5 μm or less in $R_{p-v}$. By the surface roughness planarizing to 0.5 μm or less in $R_{p-v}$, Group-III nitride crystal suited to the manufacture of semiconductor optoelectronic and electronic devices is produced. Herein, surface roughness $R_{p-v}$ is the maximum perpendicular separation between the peaks and the valleys along the surface within a square area 1.25 mm to a side located in the middle of the principal crystal plane.

The foregoing Group-III nitride crystal substrate manufacturing method enables Group-III nitride crystal substrates whose dislocation density is no more than $1 \times 10^7$ dislocations/$cm^2$ to be produced.

Figure 3A:
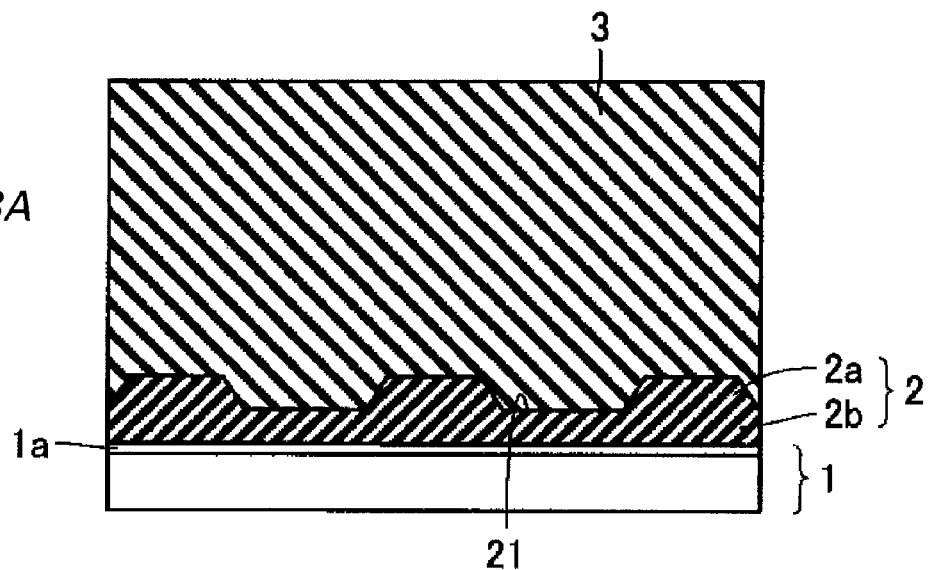
FIG. 3A illustrates a first Group-III nitride crystal and a second Group-III nitride crystal formed onto a substrate.
Figure 3B:
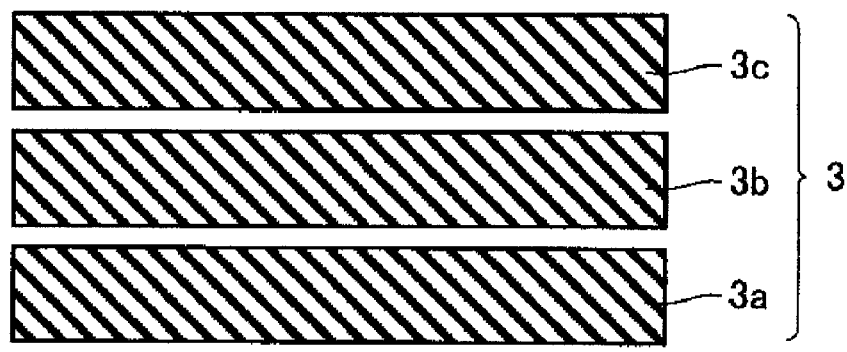
FIG. 3B illustrates a step of slicing the second Group-III nitride crystal.
Figure 3B:
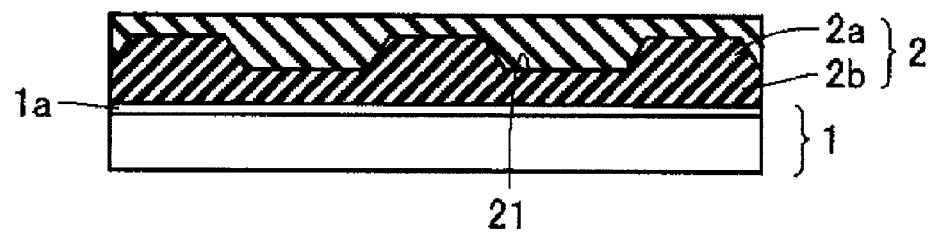

A preferred method of manufacturing a Group-III nitride crystal substrate in the present invention in a different aspect includes—with reference to FIGS. 1 and 3—a step of growing, by liquid-phase epitaxy, a first Group-III nitride crystal 2 onto a substrate 1, as illustrated in FIG. 1A; a step of growing, by HVPE, a second Group-III nitride crystal 3 onto the first Group-III nitride crystal 2, as illustrated in FIGS. 1B-1D; and a step of dividing the second Group-III nitride crystal 3, as indicated in FIGS. 3A and 3B, by slicing or cleavage.

As described above, inasmuch as sizably thick Group-III nitride crystal is readily produced with HVPE because the crystal-growth rate can be increased to upwards of 100 μm/hr, a plurality of Group-III nitride crystal substrates can be simultaneously obtained by dividing the thick Group-III nitride crystal. In this respect, either a slicing or a cleavage technique is utilized as the way of dividing the crystal. "Slicing" means dividing the crystal mechanically with an electroplated diamond wheel (diamond metal bond disc), or with a similar slicer having the cutting edge on the outer circumference, while "cleavage" means dividing the crystal along a crystal-lattice face.

The foregoing Group-III nitride crystal substrate manufacturing method makes it possible simultaneously to produce multiple Group-III nitride crystal substrates whose dislocation density is no more than $1 \times 10^7$ dislocations/cm².

It should be understood that, in the step of growing the first Group-III nitride crystal onto the base substrate, specifying the lattice plane orientation of the base substrate is not an issue in the present invention. That is, onto for example the (0001) plane of a base substrate 1 (turning again to FIG. 1), after a first Group-III nitride crystal is grown by liquid-phase epitaxy, a second Group-III nitride crystal can be grown by vapor-phase epitaxy onto the (0001) plane of the first Group-III nitride crystal. Likewise, with reference to FIG. 4, after a first Group-III nitride crystal is grown by liquid-phase epitaxy onto for example the (1100) plane of a base substrate, a second Group-III nitride crystal can be grown by vapor-phase epitaxy onto the (0001) plane of the first Group-III nitride crystal.

Figure 4A:
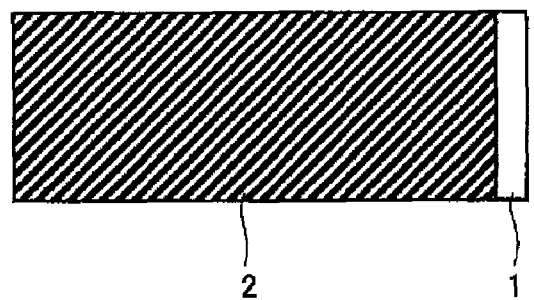
FIG. 4A illustrates a step of growing a first Group-III nitride crystal by liquid-phase epitaxy.
Figure 4B:
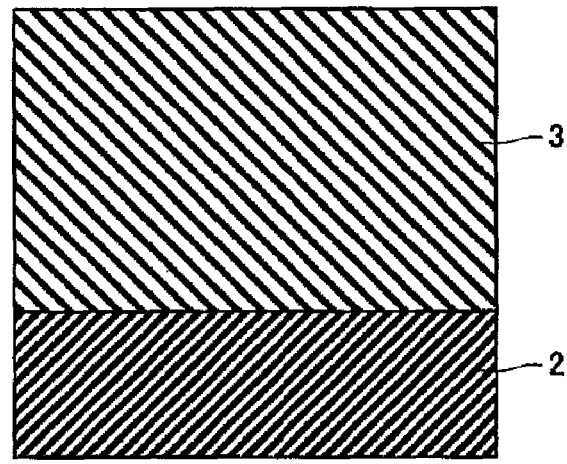
FIG. 4B illustrates a step of growing a second Group-III nitride crystal by vapor-phase epitaxy.
Figure 4C:
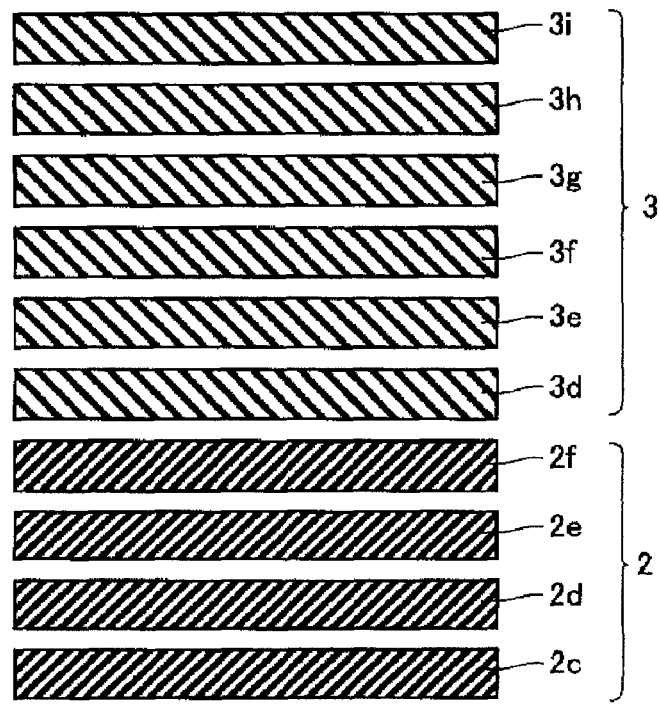
FIG. 4C illustrates a step of slicing the first and second Group-III nitride crystals.

In this regard, a preferred method, illustrated in FIG. 4, of manufacturing a Group-III nitride crystal substrate in the present invention in a still different aspect includes: a step of growing a first Group-III nitride crystal 2 onto a base substrate 1, as illustrated in FIG. 4A; a step of growing a second Group-III nitride crystal 3 onto the first Group-III nitride crystal 2, as illustrated in FIG. 4B; and a step of dividing, by slicing or cleavage, the first Group-III nitride crystal 2 and the second Group-III nitride crystal 3, as indicated in FIG. 4C.

As set forth above, by combining with liquid-phase epitaxy—which produces crystal of low dislocation density, but whose crystal-growth rate is low and by which planarization of the crystal surface is problematic—vapor-phase epitaxy such as HVPE or MOCVD, the present invention affords Group-III nitride crystal that is of low dislocation density and is inexpensive to manufacture, and a method of manufacturing such crystal, as well as Group-III nitride crystal substrates and methods of manufacturing the substrates.

That is, in the foregoing methods of manufacturing Group-III nitride crystal substrates, inasmuch as growth of Group-III nitride crystal is carried out split into two cycles, by liquid-phase epitaxy and vapor-phase epitaxy, in a superficial sense the steps increase. But because liquid-phase epitaxy serves to decrease the dislocation density, and because by vapor-phase epitaxy the crystal surface planarizes—which saves on polishing and other surface-processing labor—and because the simultaneous production of multiple Group-III nitride crystal substrates by high-speed growth of Group-III nitride crystal is made possible, the result is that high-quality Group-III nitride crystal substrates can be produced at low cost.

Group-III nitride crystal substrates involving the present invention are Group-III nitride crystal substrates manufactured by the Group-III nitride crystal substrate manufacturing methods set forth above. The foregoing manufacturing methods yield Group-III nitride crystal substrates of low dislocation density. In turn, the dislocation density of a Group-III nitride crystal substrate involving the present invention in a preferred aspect is $1 \times 10^7$ dislocations/cm². The lower the dislocation density of the Group-III nitride crystal substrate is, the lower can be the dislocation density of an epitaxial layer formed onto that substrate, and the more favorable will be characteristics of the semiconductor devices obtained.

Group-III nitride semiconductor devices involving the present invention incorporate the foregoing Group-III nitride crystal substrates. Semiconductor devices incorporating the afore-described Group-III nitride crystal substrates of low dislocation density are lent favorable characteristics. Although the configuration of such Group-III nitride semiconductor devices is not particularly limited, a Group-III nitride semiconductor device having the following constitution would be one illustrative example.

Figure 7:
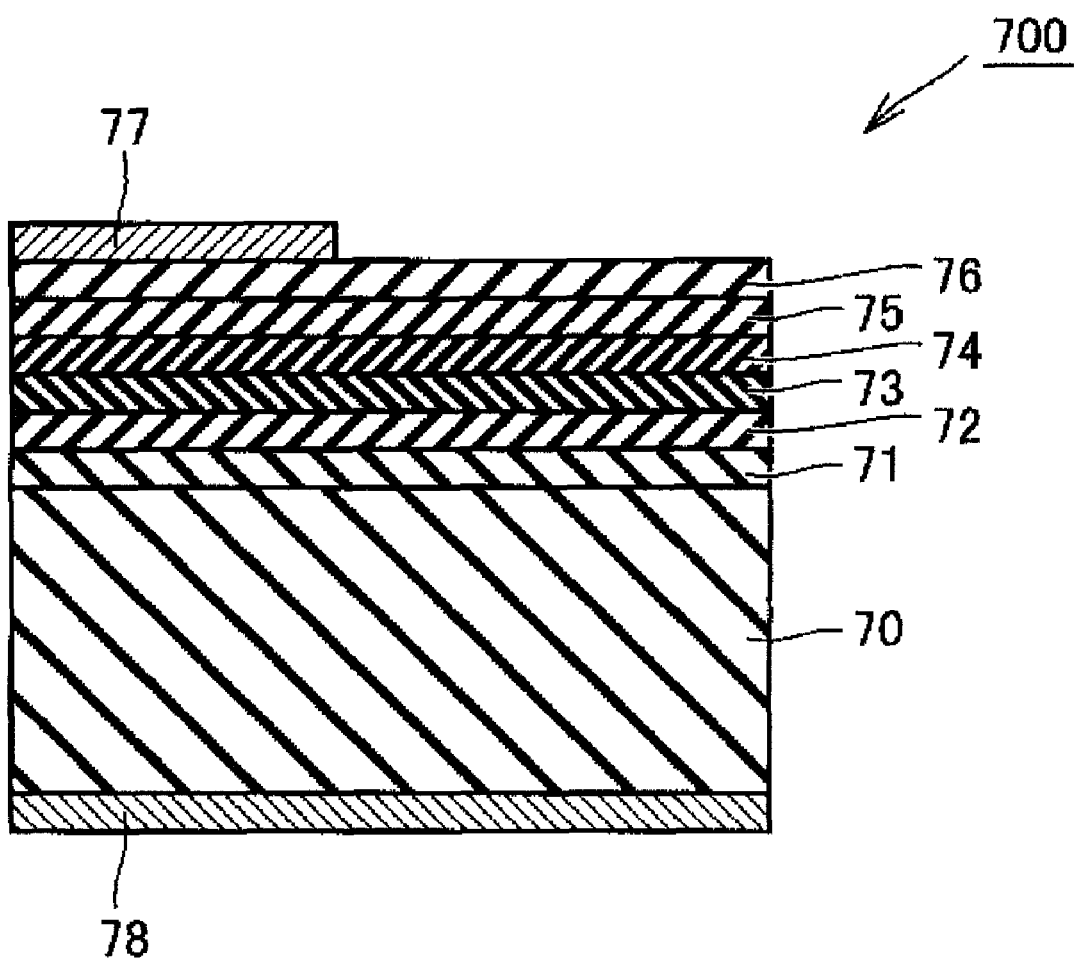
FIG. 7 is a schematic sectional view illustrating one Group-III nitride semiconductor device involving the present invention.

Namely, in one Group-III nitride semiconductor device involving the present invention, with reference to FIG. 7, an n-type GaN layer 71, an $Al_{0.3}Ga_{0.7}N$ layer 72, an $Al_{0.04}Ga_{0.96}N$ layer 73, an $Al_{0.08}Ga_{0.92}N$ layer 74, an $Al_{0.3}Ga_{0.7}N$ layer 75, and a p-type GaN layer 76 are in order formed as epitaxial layers onto one of the principal faces of a Group-III nitride crystal substrate 70. Further, a Pd/Au laminated electrode, serving as a p-side electrode 77, is formed onto a portion of the p-type GaN layer 76 (with the Au layer contacting the p-type GaN layer 76), and an Al/Au laminated electrode, serving as an n-side electrode 78, is formed onto the other principal face of the Group-III nitride crystal substrate 70 (with the Au layer contacting the Group-III nitride crystal substrate 70). The present Group-III nitride semiconductor device 700 functions as an LED.

EMBODIMENT EXAMPLES

Group-III nitride crystal substrates, and methods of manufacturing the substrates, involving the present invention will be more specifically explained by means of Embodiment Examples 1 through 7 and Comparative Examples 1 through 3.

Example 1

Figure 5A:
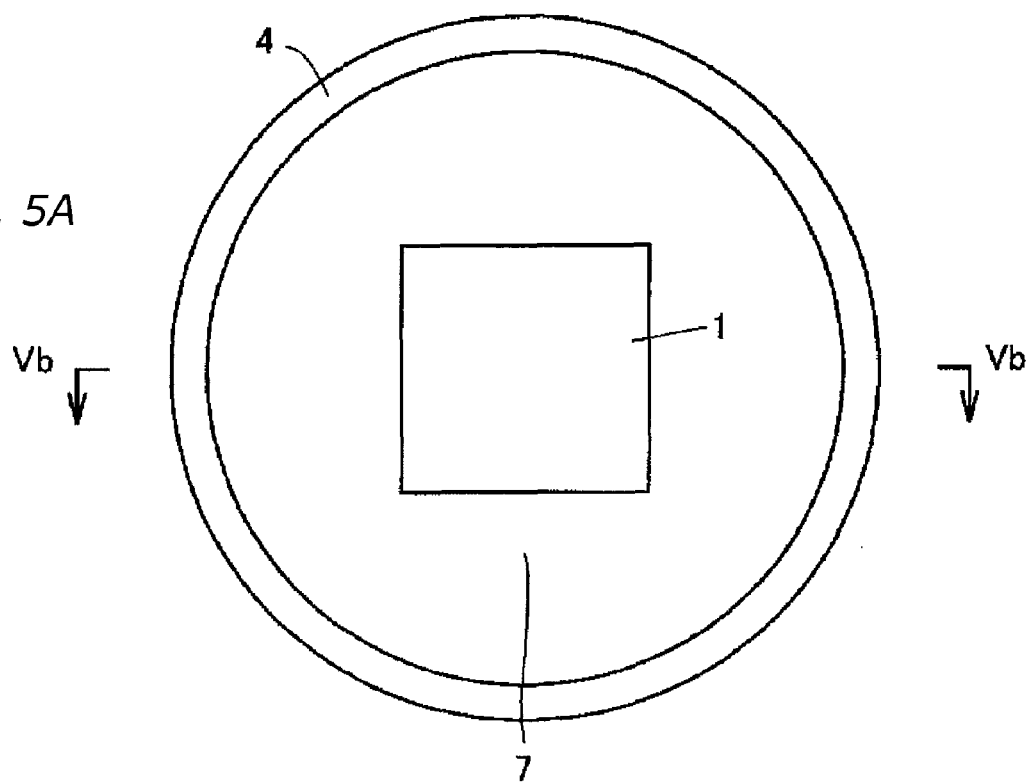
FIG. 5A shows an overhead view, and FIG. 5B, a section from orientation Vb-Vb in FIG. 5A.
Figure 5B:
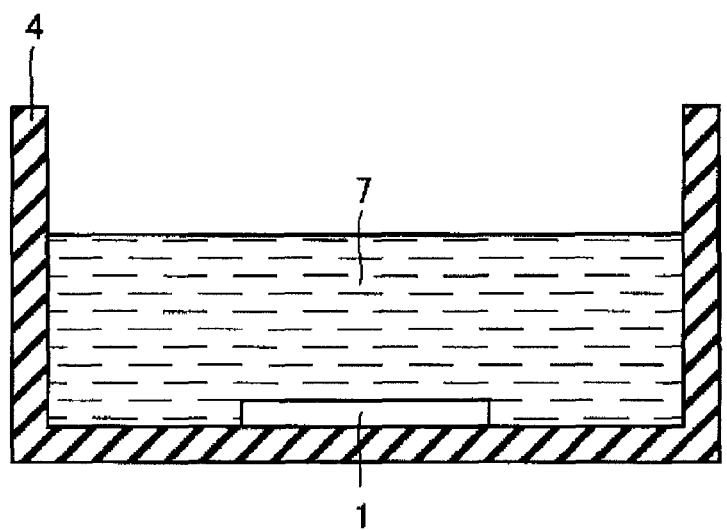

Reference is made to FIG. 1. GaN crystal as a first Group-III nitride crystal 2 was grown by a flux growth technique on the (0001) plane of a wurtzitic GaN substrate, serving as the base substrate 1, having a dislocation density of $1 \times 10^8$/cm² and measuring 10 mm×10 mm×300 μm thickness, a 10 mm×10 mm face being the (0001) plane. Specifically, as illustrated in FIG. 5, the GaN substrate was arranged in the center of an alumina crucible, serving as a reaction chamber 4, with the (0001) plane facing upward, and 2.0 g metallic Ga and 1.0 g metallic Na (Na flux) were put into the alumina crucible and heated to form on the (0001) plane of the GaN substrate 800° C. molten Ga—Na, as a melt 7, (the surface level of the melt was 2 mm); and by supplying $N_2$ gas into the Ga—Na melt for 3 hours to bring the pressure to 50 MPa, GaN crystal, having features 2a being in the form of hexagons when viewed from overhead and trapezoidal in section, as illustrated in FIG. 2, was produced as the first Group-III nitride crystal 2. The thickness of the first Group-III nitride crystal was about 9 μm to 12 μm. The first Group-III nitride crystal was observed with a transmission electron microscope to measure its dislocation density, and the dislocation density of the features 2a was found to be $6 \times 10^5$/cm², while the average dislocation density as a whole of the features 2a and the floor 2b was $5 \times 10^6$/cm². The surface roughness $R_{p-v}$ of the first Group-III nitride crystal was measured with a contact profilometer within a square-shaped extent 1.25 mm to a side, wherein the roughness was 3 μm.

Next, GaN crystal as a second Group-III nitride crystal 3 was grown on the first Group-III nitride crystal 2 by MOCVD.

Specifically, onto the substrate on which the first Group-III nitride crystal had been grown, and in a molar ratio of 1:2000:7000:9000, TMG gas, NH$_3$ gas, H$_2$ gas (carrier gas), and N$_2$ gas (carrier gas) were supplied for 2 hours at 1100° C. and 101 kPa, and at a total gas flow rate of 40000 sccm (herein, "sccm" indicates gas flow rate (cm$^3$/min) under standard conditions (1013 hPa and 273° C.)) to grow a 6 μm-thick GaN crystal as the second Group-III nitride crystal, yielding a GaN crystal substrate as the Group-III nitride crystal substrate. In this case, the dislocation density of the second Group-III nitride crystal was 2×10$^6$/cm$^2$ and the crystal surface planarized to a surface roughness R$_{p-v}$ of 0.1 μm. The results are tabulated in Table I.

Comparative Example 1

Without the step of growing the first Group-III nitride crystal being carried out, GaN crystal as a second Group-III nitride crystal 3 was grown by MOCVD directly on, as a base substrate 1, a GaN substrate (with the same dimensions as those of the GaN substrate of Example 1—all the substrates in the following Examples and Comparative Examples had the same dimensions), yielding a GaN crystal substrate. The MOCVD growth conditions were identical to those in Example 1. In this case, the GaN crystal thus obtained had a thickness of 6 μm and a dislocation density of 6×10$^7$/cm$^2$. The surface roughness R$_{p-v}$ of the GaN crystal was 0.1 μm, and no discernible surface breaks were observed by visual observation. The results are tabulated in Table I.

Example 2

GaN crystal as a first Group-III nitride crystal was grown on a GaN substrate by a flux growth technique in the same manner as in Example 1. The dislocation density of the features of the first Group-III nitride crystal was 7×10$^5$/cm$^2$, and the average dislocation density overall of the features and the floor was 8×10$^6$/cm$^2$.

Next, GaN crystal as a second Group-III nitride crystal 3 was grown on the first Group-III nitride crystal by HVPE. Specifically, onto the substrate on which the first Group-III nitride crystal had been grown and in a molar ratio of 10:1000:7000, GaCl gas, NH$_3$ gas, and H$_2$ gas (carrier gas) were supplied at 1030° C. and 101 kPa and at a total gas flow rate of 8010 sccm for 1 hour to grow a 5 μm-thick GaN crystal as a second Group-III nitride crystal, whereby a GaN crystal substrate was produced. In this case, the dislocation density of the second Group-III nitride crystal was 7×10$^6$/cm$^2$. The surface roughness R$_{p-v}$ was 0.5 μm, and hexagonally shaped features were observed on the surface by visual observation. The results are tabulated in Table I.

Comparative Example 2

Without the step of growing a first Group-III nitride crystal being carried out, GaN crystal as a second Group-III nitride crystal 3 was grown by HVPE directly on a GaN substrate as a base substrate 1, yielding a GaN crystal substrate. The HVPE growth conditions were identical to those in Example 2. The GaN crystal thus obtained had a thickness of 5 μm and a dislocation density of 8×10$^7$/cm$^2$. The surface roughness R$_{p-v}$ thereof was 0.5 μm. The results are tabulated in Table I.

Example 3

Reference is made to FIG. 1. Excepting that as a base substrate 1, a substrate measuring 10 mm×10 mm×300 μm thickness was used, in which on the (0001) plane of a sapphire substrate whose 10 mm×10 mm face was the (0001) plane, a GaN crystal layer—being a Group-III nitride crystal layer 1a, (the 10 mm×10 mm face being the (0001) plane)—was formed, GaN crystal as a first Group-III nitride crystal (dislocation density: 6×10$^5$/cm$^2$ in the features and an average of 7×10$^6$/cm$^2$ as a whole in the features and the floor), and a second Group-III nitride crystal (dislocation density: 6×10$^6$/cm$^2$) were grown in the same manner as in Example 1, yielding a GaN crystal substrate. In this case, the formation of the GaN crystal layer was carried out by MOCVD. Specifically, gases (TMG gas, NH$_3$ gas, H$_2$ gas (carrier gas), and N$_2$ gas (carrier gas)) were supplied for 1 hour under the same conditions as in Example 1 to form a GaN crystal layer having a thickness of about 3 μm and a surface roughness R$_{p-v}$ of 0.1 μm. The results are tabulated in Table I.

Example 4

Reference is made to FIG. 1. A first Group-III nitride crystal 2 was grown in the same manner as in Example 3. The dislocation density of the first nitride crystal was 8×10$^5$/cm$^2$ in its features, while the average dislocation density as a whole of the features and the floor was 8×10$^6$/cm$^2$.

Next, GaN crystal as a second Group-III nitride crystal 3 was grown on the first Group-III nitride crystal 2 by HVPE. Specifically, onto a substrate on which the first Group-III nitride crystal had been grown, and in a molar ratio of 120:1000:7000, GaCl gas, NH$_3$ gas, and H$_2$ gas (carrier gas) were supplied at 1030° C. and 101 kPa, and at a total gas flow rate of 8120 sccm for 15 hours, whereby a second Group-III nitride crystal having a thickness 1.6 mm was produced. The (0001) plane of the second Group-III nitride crystal had a surface roughness in R$_{p-v}$ of 12 μm.

Next, the substrate 1 on which the first Group-III nitride crystal 2 and the second nitride crystal layer 3 had been grown was fixed to a glass disk and sliced at a pitch of 520 μm using a diamond metal-bond disc slicer having a 200 μm-thick cutting edge on the circumference, whereby three Group-III nitride crystal substrates 3a, 3b, and 3c each having a thickness of 320 μm were produced. After the slicing process each of the Group-III nitride crystal substrates had a surface roughness R$^{p-v}$ of 1 μm, and further by polishing them to a thickness 300 μm, the surface roughness R$_{p-v}$, of all the Group III nitride crystal substrates was made 0.01 μm. The dislocation densities of the three Group-III nitride crystal substrates 3a, 3b, and 3c were 3×10$^6$/cm$^2$, 8×10$^5$/cm$^2$, and 3×10$^5$/cm$^2$, respectively. Thus, Group-III nitride crystal substrates that have low dislocation density and small surface roughness R$_{p-v}$ and are suitable for substrates for semiconductor optoelectronic and electronic devices were efficiently fabricated. The results are tabulated in Table I.

Comparative Example 3

Without the step of growing the first Group-III nitride crystal being carried out, GaN crystal as a second Group-III nitride crystal 3 was grown by HVPE directly on a GaN substrate as a base substrate 1, yielding a GaN crystal substrate. The HVPE growth conditions were identical to those in Example 4, except that the growth time was 3 hours. The GaN crystal thus obtained had a thickness of 300 μm and a dislocation density of 3×10$^7$/cm$^2$. The surface roughness R$_{p-v}$ thereof was 3 μm. The results are tabulated in Table I.

Example 5

Figure 6A:
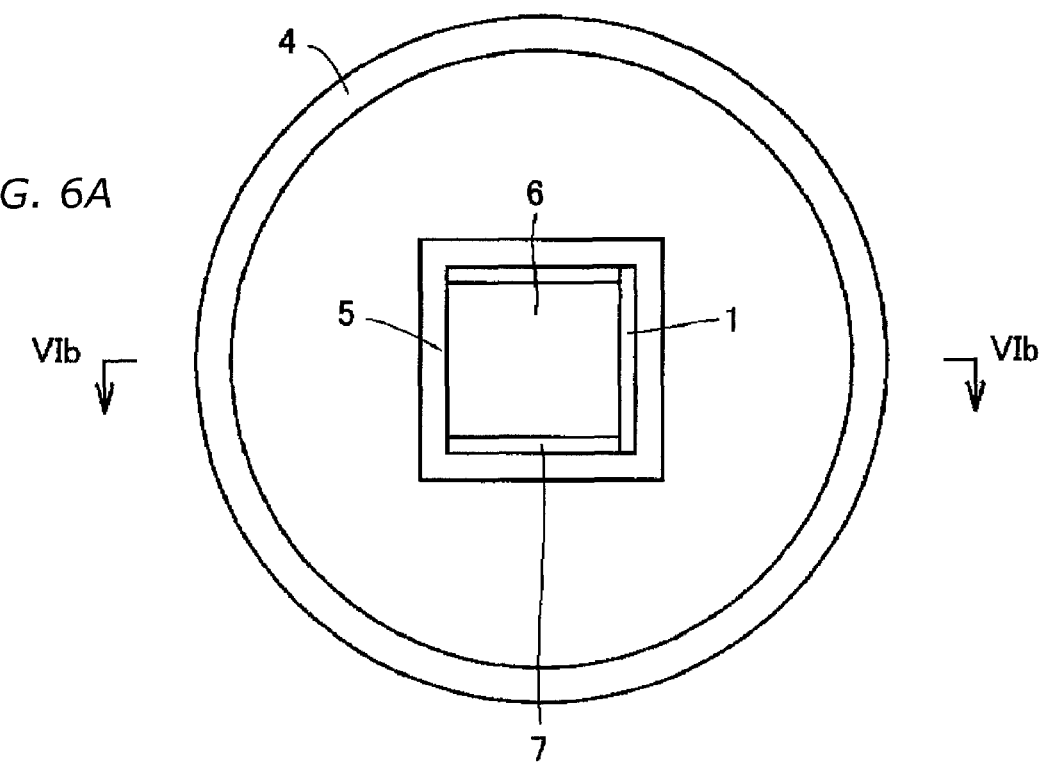
FIG. 6A shows an overhead view, and FIG. 6B, a section from orientation VIb-VIb.
Figure 6B:
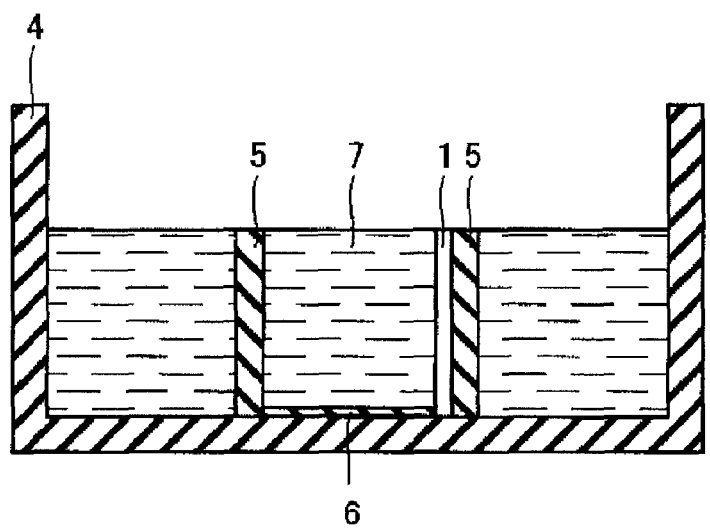

Reference is made to FIG. 4. GaN crystal as a first Group-III nitride crystal 2 was grown by a flux growth technique on the (1$\bar{1}$00) plane of, as a base substrate 1, a wurtzitic GaN substrate having a dislocation density of 1×10⁸/cm² and measuring 2 mm×10 mm×300 μm thickness, with a 2 mm×10 mm face being the (1$\bar{1}$00) plane and a 10 mm×300 μm surface being the (0001) plane. Specifically, as illustrated in FIG. 6, a GaN substrate, being the base substrate 1, was retained, with the (0001) plane horizontal, in the middle of an alumina crucible, being the reaction chamber 4, in (FIG. 6A) an alumina frame 5 having 10 mm sides and a height of 2 mm, and an alumina plate 6 having 9.3 mm sides and a thickness of 0.3 mm; and 2.0 g metallic Ga and 1.0 g metallic Na (Na flux) were introduced into the alumina crucible and heated to form 800° C. molten Ga—Na as a melt 7 (the surface level of the melt was 2 mm) that would come into contact with the (1$\bar{1}$00) face of the GaN substrate. Into the Ga—Na melt, N₂ gas was supplied for 250 hours to bring the pressure to 50 MPa, yielding GaN crystal as the first Group-III nitride crystal 2 (FIG. 4A).

The GaN crystal as a first Group-III nitride crystal 2 grew 10 mm from the (1$\bar{1}$00) plane of the base substrate 1 in the <$\bar{1}$100> axis direction, which is parallel to the level of the Ga—Na melt, resulting in GaN crystal measuring 2 mm×10 mm×10 mm thickness. The dislocation density of the GaN crystal was measured, wherein the dislocation density was a low 4×10⁵/cm².

Next, reference is made to FIGS. 4A and 4B. The base substrate 1 was sliced off with the slicer of Example 4, having the circumferential cutting edge, and GaN crystal as a second Group-III nitride crystal 3 was grown by HVPE on the (0001) plane of the GaN crystal being the first Group-III nitride crystal 2, in the same manner as in Example 4 except that the growth time was 30 hours. The thickness along the <0001>orientation of the GaN crystal that was the second Group-III nitride crystal 3 was 3.5 mm at its thickest part and 3.2 mm at its thinnest part.

Next, reference is made to FIGS. 4B and 4C. The (0001) plane of the nitride crystal, in which the first nitride crystal 2 and the second nitride crystal 3 were united, was brought into cohesive contact with a glass disk (not shown), and the crystal was sliced with the Example 4 slicer having the circumferential cutting edge, and polished. Thus, from the first nitride crystal 2 and the second nitride crystal 3, Group-III nitride crystal substrates 2c, 2d, 2e, 2f, 3d, 3e, 3f, 3g, 3h, and 3i, each having a thickness of 300 μm and a surface roughness $R^{p-v}$ of 0.01 μm ,were produced. The dislocation densities of these Group-III nitride crystal substrates were a low 4×10⁵/cm⁻² for the Group-III nitride crystal substrates 2c, 2d, 2e, and 2f, 2×10⁵/cm⁻² for the Group-III nitride crystal substrates 3d, 3e, and 3f, and 1×10⁵/cm⁻² for the Group-III nitride crystal substrates 3g, 3h, and 3i. The results are tabulated in Table I.

Thus, in the present Example, low dislocation GaN crystal serving as a first Group-III nitride crystal can be grown on the (1$\bar{1}$00) plane, which is a plane other than the (0001) plane, of the base substrate by a flux growth technique, which is a liquid-phase technique; moreover lower dislocation density GaN crystal can be grown on the first Group-III nitride crystal by HVPE, which is a vapor-phase technique, faster than the liquid-phase technique. This means that a number of low dislocation density Group-III nitride crystal substrates can be produced in a short time irrespective of the lattice-plane orientation of the base substrate.

Example 6

AlN crystal as a second Group-III nitride crystal was grown by HVPE on, as a first Group-III nitride crystal, GaN crystal that was grown in the same manner as in Example 1 (dislocation density: 6×10⁵/cm² in the features, and an average of 3×10⁶/cm² as a whole in the features and the floor). Specifically, by supplying AlCl₃ gas, NH₃ gas, and H₂ gas (carrier gas) in a molar ratio of 10:3000:8000 at 1030° C. and 101 kPa and at a total gas flow rate of 11010 sccm for 14 hours, a 520 μm-thick AlN crystal was grown as the second Group-III nitride crystal. The dislocation density of the second Group-III nitride crystal was 6×10⁵/cm², and the surface roughness in $R_{p-v}$ of the crystal surface was 4 μm. The results are tabulated in Table I.

Example 7

Al₀.₃Ga₀.₇N crystal as a second Group-III nitride crystal was grown by HVPE on, as a first Group-III nitride crystal, GaN crystal that was grown in the same manner as in Example 1 (dislocation density: 5×10⁵/cm² in the features, and an average of 6×10⁶/cm² as a whole in the features and the floor). Specifically, by supplying GaCl gas, AlCl₃ gas, NH₃ gas, and H₂ gas (carrier gas) in a molar ratio of 25:10:3000:8000 at 1030° C. and 101 kPa and at a total gas flow rate of 11035 sccm for 15 hours, a 480 μm-thick Al₀.₃Ga₀.₇N crystal was grown as the second Group-III nitride crystal. The dislocation density of the second Group-III nitride crystal was 4×10⁵/cm², and the surface roughness in $R_{p-v}$ of the crystal surface was 3 μm. The results are tabulated in Table I.

TABLE I

|  |  | Comp. Ex. 1 | Comp. Ex. 2 | Comp. Ex. 3 | Emb. Ex. 1 | Emb. Ex. 2 | Emb. Ex. 3 | Emb. Ex. 4 | Emb. Ex. 5 | Emb. Ex. 6 | Emb. Ex. 7 |
|---|---|---|---|---|---|---|---|---|---|---|---|
|  | Substrate | GaN | GaN | GaN | GaN | GaN | GaN/Sapphire | GaN/Sapphire | GaN | GaN | GaN |
| 1ˢᵗ Group III Nitride Crystal | Crystal composition |  |  |  | GaN | GaN | GaN | GaN | GaN | GaN | GaN |
|  | Growth method |  |  |  | Flux | Flux | Flux | Flux | Flux | Flux | Flux |
|  | Dislocation density (no./cm²) |  |  |  |  |  |  |  |  |  |  |
|  | a) Features |  |  |  | a) 6 × 10⁵ | a) 7 × 10⁵ | a) 6 × 10⁵ | a) 8 × 10⁵ |  | a) 6 × 10⁵ | a) 5 × 10⁵ |
|  | b) Overall avg. |  |  |  | b) 5 × 10⁶ | b) 8 × 10⁶ | b) 7 × 10⁶ | b) 8 × 10⁶ | b) 4 × 10⁵ | b) 3 × 10⁶ | b) 6 × 10⁶ |
| 2ⁿᵈ Group III Nitride Crystal | Crystal comp. | GaN | GaN | GaN | GaN | GaN | GaN | GaN | GaN | AlN | Al₀.₃Ga₀.₇N |
|  | Growth method | MOCVD | HVPE | HVPE | MOCVD | HVPE | MOCVD | HVPE | HVPE | HVPE | HVPE |
|  | Thickness (μm) | 6 | 5 | 300 | 6 | 5 | 3 | 1600 | 3200 to 3500 | 520 | 480 |
|  | Dislocation | 6 × 10⁷ | 8 × 10⁷ | 3 × 10⁷ | 2 × 10⁶ | 7 × 10⁶ | 6 × 10⁶ | 3 × 10⁵ | 1 × 10⁵ | 6 × 10⁵ | 4 × 10⁵ |

TABLE I-continued

|  | Comp. Ex. 1 | Comp. Ex. 2 | Comp. Ex. 3 | Emb. Ex. 1 | Emb. Ex. 2 | Emb. Ex. 3 | Emb. Ex. 4 | Emb. Ex. 5 | Emb. Ex. 6 | Emb. Ex. 7 |
|---|---|---|---|---|---|---|---|---|---|---|
| density (no./cm$^2$) |  |  |  |  |  |  | to 3 × 10$^6$ | to 4 × 10$^5$ |  |  |
| Surface roughness R$_{p\text{-}v}$(μm) | 0.1 | 0.5 | 3 | 0.1 | 0.5 | 0.1 | 12 | — | 4 | 3 |

As is evident from Table 1, the dislocation densities of Group-III nitride crystal in the cases in which first Group-III nitride crystal was grown by liquid-phase epitaxy onto a base substrate and subsequently second Group-III nitride crystal was grown by vapor-phase epitaxy, was, in comparison with cases in which Group-III nitride crystal was directly grown on a substrate, lowered and could be brought down to 1×10$^7$ dislocations/cm$^2$ or less. Even in the cases in which crystals whose chemical compositions differed were grown as the Group-III nitride crystal, the dislocation densities of the Group-III nitride crystal could be brought down to 1×10$^7$/cm$^2$ or less.

Moreover, by growing, at high speed using HVPE, a second Group-III nitride crystal onto a first Group-III nitride crystal to create a sizably thick Group-III nitride crystal and then slicing the crystal, a plurality of low dislocation density Group-III nitride crystal substrates with a dislocation density of no more than 1×10$^7$/cm$^2$ could be produced simultaneously.

Next, Group-III nitride semiconductor devices involving the present invention will also be explained specifically, by means of Comparative Example 4 and Embodiment Examples 8 through 10.

Comparative Example 4

GaN crystal serving as a second Group-III nitride crystal that was grown directly on a GaN substrate as in Comparative Example 3 was cut off from the GaN substrate, and the surface was polished to produce a GaN crystal substrate (dislocation density: 3×10$^7$/cm$^2$) measuring 10 mm×10 mm×250 μm thickness and with a surface roughness in R$_{p\text{-}v}$ of 2 nm or less.

Next, reference is made to FIG. 7. On one of the principal faces of the GaN crystal substrate, being a Group-III nitride crystal substrate 70, a 1 μm-thick n-type GaN layer 71, a 10 nm-thick Al$_{0.3}$Ga$_{0.7}$N layer 72, a 3 nm-thick Al$_{0.04}$Ga$_{0.96}$N layer 73, a 3 nm-thick thick Al$_{0.08}$Ga$_{0.92}$N layer 74, a 10 nm-thick Al$_{0.3}$Ga$_{0.7}$N layer 75, and a p-type GaN layer 76 were in that order grown epitaxially by MOCVD.

Next, on a portion of the p-type GaN layer 76 that served as a p-side electrode 77, an 80 μm-diameter Pd (thickness 5 nm)/Au (thickness 5 nm) laminated electrode (with the Au layer being in contact with the p-type GaN layer 76) was formed. Likewise, on the other principal face of the Group-III nitride crystal substrate 70 serving as an n-side electrode 78, an Al (thickness 10 nm)/Au (thickness 10 nm) laminated electrode (with the Au layer being in contact with the Group-III nitride crystal substrate 70) was formed.

The peak emission wavelength of the LED, being a semiconductor device 700, thus obtained was measured with a spectrophotometer and was found to be 360 nm. Taking the relative intensity of the LED of the present Comparative Example at the peak emission as 1, relative intensities at the peak emission were obtained for LEDs in the following Examples.

Example 8

Reference is made to FIG. 3. A surface of a 320 μm-thick GaN crystal substrate that was sliced out of the second Group-III nitride crystal obtained in Example 4, being the Group-III nitride crystal substrate 3c, was polished to produce a GaN crystal substrate (dislocation density: 3×10$^5$/cm$^2$) measuring 10 mm×10 mm×250 μm thickness and with a surface roughness in R$_{p\text{-}v}$ of 2 nm or less. Using the GaN crystal substrate as a Group-III nitride crystal substrate, an LED was fabricated as a Group-III nitride semiconductor device in the same manner as in Comparative Example 4. The peak emission wavelength of the LED thus fabricated was 360 nm, and the relative intensity thereof was 1.2 at the peak emission.

Example 9

A 520 μm-thick AlN crystal that was grown as the second Group-III nitride crystal in Example 6 was cut off from the GaN substrate, being first Group-III nitride crystal, and the surface was polished to produce an AlN crystal substrate (dislocation density: 6×10$^5$/cm$^2$) measuring 10 mm×10 mm×250 μm thickness and with a surface roughness in R$_{p\text{-}v}$ of 2 nm or less. Using the AlN crystal substrate as a Group-III nitride crystal substrate, an LED was fabricated as a Group-III nitride semiconductor device in the same manner as in Comparative Example 4. The peak emission wavelength of the LED thus fabricated was 360 nm, and the relative intensity thereof at the peak emission was 1.5.

Example 10

A 480 μm-thick Al$_{0.3}$Ga$_{0.7}$N crystal grown as the second Group-III nitride crystal of Example 7 was cut off from the GaN substrate, being first Group-III nitride crystal, and the surface was polished to produce an Al$_{0.3}$Ga$_{0.7}$N crystal substrate (dislocation density: 4×10$^5$/cm$^2$) measuring 10 mm×10 mm×250 μm thickness and with a surface roughness R$_{p\text{-}v}$ of 2 nm or less. Using the Al$_{0.3}$Ga$_{0.7}$N crystal substrate as a Group-III nitride crystal substrate, an LED was fabricated as a Group-III nitride semiconductor device in the same manner as in Comparative Example 4. The peak emission wavelength of the LED thus fabricated was 360 nm, and the relative intensity thereof at the peak emission was 1.5.

From a comparison between Examples 8 through 10 and Comparative Example 4, it is evident that the LEDs incorporating a Group-III nitride crystal substrate produced from second Group-III nitride crystal that was grown by vapor-phase epitaxy on the first Group-III nitride crystal that had been grown by liquid-phase epitaxy on the base substrate demonstrated a greater peak emission intensity than the LED comprising the Group-III nitride crystal substrate produced from the Group-III nitride crystal that was grown directly on the base substrate by a vapor-phase epitaxy. This is presumably because the dislocation density of the Group-III nitride crystal substrate produced from the second Group-III nitride crystal proved to be lower than that of the Group-III nitride crystal substrate produced from the Group-III nitride crystal grown directly on the base substrate by vapor-phase epitaxy.

The present invention is broadly applicable to Group-III nitride crystal, and Group-III nitride crystal substrates, that are of low dislocation density and are inexpensive to manufacture, to methods of manufacturing such substrates, and to Group-III nitride semiconductor devices that incorporate the Group-III nitride crystal substrates.

Only selected embodiments have been chosen to illustrate the present invention. To those skilled in the art, however, it will be apparent from the foregoing disclosure that various changes and modifications can be made herein without departing from the scope of the invention as defined in the appended claims. Furthermore, the foregoing description of the embodiments according to the present invention is provided for illustration only, and not for limiting the invention as defined by the appended claims and their equivalents.

What is claimed is:

1. A Group-III nitride crystal substrate manufacturing method comprising:
    a step of growing, by liquid-phase epitaxy utilizing gaseous $N_2$ as a source material, a first Group-III nitride crystal onto a freestanding Group-III nitride crystal base substrate, and in the growth of the first Group-III nitride crystal, forming in the growth surface first Group-III nitride crystal features on a floor thereof;
    a step of growing, by hydride vapor-phase epitaxy onto the first Group-III nitride crystal surface having the features and the floor, a second Group-III nitride crystal to a thickness of at least 1600 μm to thereby impart to the second Group-III nitride crystal a dislocation density of not greater than $3 \times 10^6/cm^2$, in such a way that the growth rate $V_H$ of the second Group-III nitride crystal on sloping surfaces of the features on the first Group-III nitride crystal is greater than the growth rate $V_v$ of the second Group-III nitride crystal on the flat surface of the floor of, and on flat surfaces of the features on, the first Group-III nitride crystal, and such that the second Group-III nitride crystal covers over the flat surface of the floor and the flat surfaces of the features; and
    a step of dividing the first Group-III nitride crystal and/or the second Group-III nitride crystal, by slicing or cleavage.

2. A Group-III nitride crystal substrate manufacturing method comprising:
    a step of growing, by liquid-phase epitaxy utilizing gaseous $N_2$ as a source material, a first Group-III nitride crystal onto a freestanding Group-III nitride crystal base substrate, and in the growth of the first Group-III nitride crystal, forming in the growth surface first Group-III nitride crystal features on a floor thereof;
    a step of growing, by hydride vapor-phase epitaxy onto the first Group-III nitride crystal surface having the features and the floor, a second Group-III nitride crystal to a thickness of at least 3200 μm to thereby impart to the second Group-III nitride crystal a dislocation density of not greater than $4 \times 10^5/cm^2$, in such a way that the growth rate $V_H$ of the second Group-III nitride crystal on sloping surfaces of the features on the first Group-III nitride crystal is greater than the growth rate $V_v$ of the second Group-III nitride crystal on the flat surface of the floor of, and on flat surfaces of the features on, the first Group-III nitride crystal, and such that the second Group-III nitride crystal covers over the flat surface of the floor and the flat surfaces of the features; and
    a step of dividing the first Group-III nitride crystal and/or the second Group-III nitride crystal, by slicing or cleavage.

\* \* \* \* \*